United States Patent
Ishibashi

(10) Patent No.: US 9,852,929 B2
(45) Date of Patent: Dec. 26, 2017

(54) LEAD FRAME AND MANUFACTURING METHOD OF LEAD FRAME

(71) Applicant: MITSUI HIGH-TEC , INC., Kitakyushu-shi, Fukuoka (JP)

(72) Inventor: Takahiro Ishibashi, Fukuoka (JP)

(73) Assignee: MITSUI HIGH-TEC, INC., Fukuoka (JP)

( * ) Notice: Subject to any disclaimer, the term of this patent is extended or adjusted under 35 U.S.C. 154(b) by 0 days.

(21) Appl. No.: 14/885,045

(22) Filed: Oct. 16, 2015

(65) Prior Publication Data

US 2016/0118321 A1  Apr. 28, 2016

(30) Foreign Application Priority Data

Oct. 23, 2014  (JP) .................................. 2014-216422

(51) Int. Cl.
*H01L 23/495* (2006.01)
*H01L 21/56* (2006.01)
*H01L 23/00* (2006.01)

(52) U.S. Cl.
CPC ............ *H01L 21/56* (2013.01); *H01L 21/566* (2013.01); *H01L 23/49565* (2013.01); *H01L 24/97* (2013.01); *H01L 21/568* (2013.01); *H01L 2224/48091* (2013.01); *H01L 2224/48247* (2013.01); *H01L 2924/181* (2013.01)

(58) Field of Classification Search
CPC ....... H01L 21/56; H01L 21/568; H01L 24/97; H01L 23/49565

USPC .......................................... 257/666; 438/123
See application file for complete search history.

(56) References Cited

U.S. PATENT DOCUMENTS

| | | | | |
|---|---|---|---|---|
| 6,610,924 B1* | 8/2003 | Lee | ...................... | H01L 23/3107 174/528 |
| 6,723,585 B1* | 4/2004 | Tu | ........................ | H01L 23/3107 174/530 |
| 2003/0071333 A1* | 4/2003 | Matsuzawa | .......... | H01L 21/4821 257/676 |
| 2003/0071344 A1* | 4/2003 | Matsuzawa | ........... | H01L 21/565 257/692 |
| 2003/0082854 A1* | 5/2003 | Kasahara | ............ | H01L 21/4839 438/123 |
| 2012/0126378 A1* | 5/2012 | San Antonio | ......... | H01L 21/561 257/659 |

FOREIGN PATENT DOCUMENTS

JP  4317665  5/2009

* cited by examiner

*Primary Examiner* — Nitin Parekh
(74) *Attorney, Agent, or Firm* — Greenblum & Bernstein, P.L.C.

(57) ABSTRACT

A lead frame includes a lead frame body processed in a predetermined shape, and including a notched part provided at an end of the lead frame body, the notched part being used as a starting point of tape-removing, a resin leakproof tape stuck on a back surface of the lead frame body, and a region of a periphery of the notched part in the back surface of the lead frame body, the region being reduced in a strength of bonding between the resin leakproof tape and the lead frame body is reduced relative to other region.

12 Claims, 5 Drawing Sheets

LEAD FRAME AND MANUFACTURING METHOD OF LEAD FRAME

CROSS REFERENCE TO RELATED APPLICATION(S)

This application is based upon and claims the benefit of priority of Japanese Patent Application No. 2014-216422 filed on Oct. 23, 2014, the contents of which are incorporated herein by reference in its entirety.

BACKGROUND OF THE INVENTION

1. Field of the Invention

The present invention relates to a lead frame capable of easily and surely removing (peeling) a resin leakproof tape, and a manufacturing method of the lead frame.

2. Description of the Related Art

In manufacture of QFN (Quad Flat No Lead Package), a resin leakproof tape (may hereinafter be simply called a "tape") is generally stuck on a lead frame so as to prevent a resin from leaking to an exposed part of a lead or a pad in the case of being sealed with the resin. That is, the lead frame is equipped with a chip (semiconductor device) and wire bonding is performed and collective molding is performed for an MAP (Molded Array Packaging) type and then, the resin leakproof tape is peeled (removed or just "de-taped"), and dicing is performed to be divided into individual pieces.

In order to prevent the occurrence of a problem that in the case of removal of tape or just "de-taping", the resin leakproof tape cannot be peeled and the lead frame is deformed or the tape is broken, a manufacturing method of a semiconductor apparatus, in which an end of a lead frame is provided with a notch etc. and a tape is removed using the notch as a starting point, is proposed as described in Japanese Patent No. 4317665 as Patent Reference 1. This method mentions that a tape 71 can be removed by being held by a clamp 72 in the portion of a notch 70 as shown in FIGS. 5A and 5B. FIGS. 5A and 5B also shows a semiconductor device 73, a lead frame body 74 (may be simply called a "lead frame"), a sealing resin 75, and a semiconductor apparatus 76.

Patent Reference 1: Japanese Patent No. 4317665

SUMMARY OF THE INVENTION

However, in the recent trend, demand for adhesion between the lead frame and the sealing resin is increased, with the result that the lead frame whose surface is roughened is increased. Also, the sticking strength of the tape is increased in order to prevent the resin from leaking to the exposed part. As a result, even in the case of using the manufacturing method of the semiconductor apparatus described in Japanese Patent No. 4317665, the sticking strength between the lead frame 74 and the tape 71 is too high and in the case of de-taping, the tape 71 cannot be peeled and the lead frame 74 may be deformed or the tape 71 may be broken. Also, when the adhesive strength between the lead frame 74 and the tape 71 is uniform, there is a problem that a great peeling force is applied to the end of the lead frame 74 and the lead frame 74 may be deformed or the tape 71 may be broken.

The present invention has been implemented in view of such circumstances, and a non-limited object of one or more aspects of the present invention is to provide a lead frame capable of easily peeling a tape tightly bonded to the lead frame, and a manufacturing method of the lead frame.

A first aspect of the present invention provides a lead frame, including: a lead frame body processed in a predetermined shape, and including a notched part provided at an end of the lead frame body, the notched part being used as a starting point of de-taping; a resin leakproof tape stuck on a back surface of the lead frame body; and a region of a periphery of the notched part in the back surface of the lead frame body, the region being reduced in a strength of bonding between the resin leakproof tape and the lead frame body is reduced relative to other region.

A second aspect of the present invention provides a lead frame according to the first aspect of the present invention, wherein the region reduced in the strength of bonding is constructed by plating formed on the back surface of the lead frame body.

A third aspect of the present invention provides a lead frame according to the first aspect of the present invention, wherein the region reduced in the strength of bonding is constructed by a recessed thin part formed on the back surface of the lead frame body.

A fourth aspect of the present invention provides a lead frame according to any one the first to third aspects of the present invention, wherein the region reduced in the strength of bonding is formed so as to have a gap of 0.05 to 2 mm from a notched end of the notched part of the lead frame body.

A fifth aspect of the present invention provides a lead frame according to the first to fourth aspects of the present invention, wherein the region reduced in the strength of bonding has a width of 0.05 to 3 mm.

A sixth aspect of the present invention provides a manufacturing method of a lead frame in which a resin leakproof tape is stuck on a back surface of a lead frame body whose end is formed with a notched part used as a starting point of de-taping, the manufacturing method including: using a heater plate for heating and sticking the resin leakproof tape on the lead frame body, the heater plate having a recessed part provided at a portion corresponding to the notched part and a periphery of the notched part to form a region reduced in a strength of bonding between the resin leakproof tape and the lead frame body.

In the lead frame according to the first to fifth aspects of the present invention and the manufacturing method of the lead frame according to the sixth aspect of the present invention, the end of the lead frame body is formed with the notched part used as the starting point of removal of tape or just "de-taping" and the region of the periphery of the notched part in the back surface of the lead frame body is reduced in the strength of bonding between the resin leakproof tape and the lead frame body, with the result that, for example, a break in the resin leakproof tape and deformation of the lead frame body in the case of peeling the resin leakproof tape are minimized.

Particularly in the lead frame according to the second aspect, the region reduced in the strength of bonding is constructed by the plating (for example, the smooth plating with Ag, Ni, Pd, Au, etc.) formed on the back surface of the lead frame body, with the result that bond properties of the resin leakproof tape are decreased accordingly, and the tape can be removed more easily.

In the lead frame according to the third aspect, the region reduced in the strength of bonding is constructed by the recessed thin part formed on the lead frame body, with the result that bond properties of the resin leakproof tape are decreased and peel properties are increased.

In the lead frame according to the fourth aspect, the region reduced in the strength of bonding is formed so as to have the gap of 0.05 to 2 mm from the notched end of the lead frame body, with the result that for the plating, the periphery is thinned by the plating thickness and peel properties of the end are improved and for the recessed thin part, the periphery is formed with a dam and consequently, in the recessed thin part, the resin leakproof tape is resistant to abutting on the lead frame body and the tape can be removed more surely.

In the lead frame according to the fifth aspect, the region reduced in the strength of bonding has the width of 0.05 to 3 mm, with the result that the region reduced in the strength of bonding is formed linearly, and the resin leakproof tape can be peeled more uniformly.

In the manufacturing method of the lead frame according to the sixth aspect, the recessed part is provided in the portion of the heater plate for heating and sticking the resin leakproof tape on the lead frame body, corresponding to the notched part and the periphery of the notched part to form the region reduced in the strength of bonding between the resin leakproof tape and the lead frame body, with the result that peel properties of the resin leakproof tape of the corresponding portion are increased.

DETAILED DESCRIPTION OF THE EXEMPLARY EMBODIMENTS

Figure 1A:
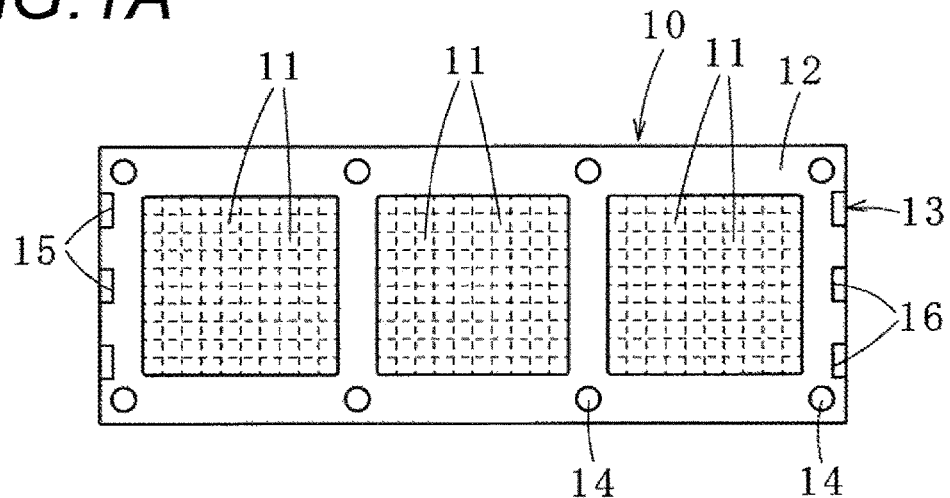
FIG. 1A is a plan view of a lead frame according to a first embodiment of the present invention.

Subsequently, embodiments embodying the present invention will be described with reference to the accompanying drawings. As shown in FIG. 1A, a lead frame 10 according to a first embodiment of the present invention has a lead frame body 12 in which multiple unit lead frames 11 are processed in a predetermined long shape arranged in a grid shape (matrix), and a resin leakproof tape 13 stuck on a back surface of the lead frame body 12. In FIG. 1A, a pilot hole 14 is also shown.

Figure 2A:
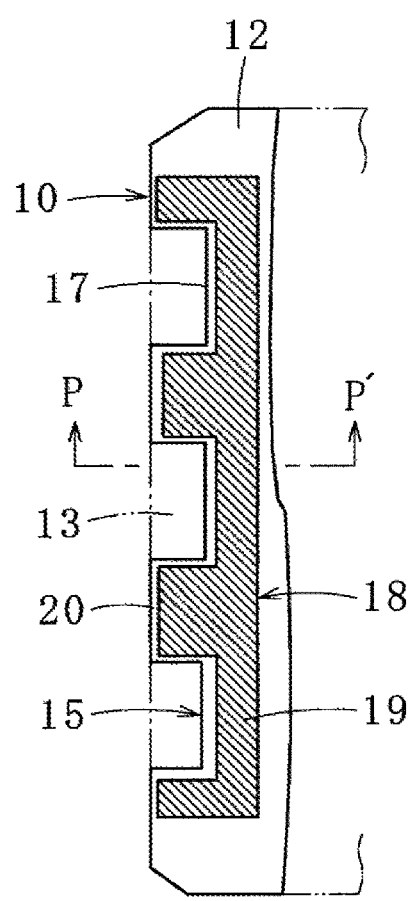
FIG. 2A is a partial back view of the lead frame according to the first embodiment of the present invention.
Figure 2B:
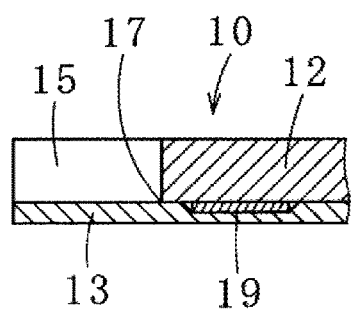
FIG. 2B is a cross-sectional view taken on arrow P-P' of FIG. 2A.

As shown in FIGS. 1A, 2A and 2B, ends of the lead frame body 12 in a longitudinal direction are respectively formed with plural (three spaced in one side in this embodiment) rectangular notched parts 15, 16, and the resin leakproof tape 13 is stuck on the back surface of the lead frame body 12 so as to cover the notched parts 15, 16. In this embodiment, the periphery of each of the notched parts 15, 16, that is, the end of the lead frame body 12 has a peel starting point part (starting point of de-taping) 17 and the resin leakproof tape 13 of this starting point part is first peeled to thereby sequentially peel the resin leakproof tape 13 from the bottom surface of the lead frame body 12. The resin leakproof tape 13 is made of, for example, a normal heat-resistant synthetic resin fiber in which an adhesive is applied to one surface. In this description, the action or function of "removing a tape from a lead frame" may be referred to as "de-taping" or "tape-removing".

Both ends (that is, the periphery of the notched parts 15, 16) of the back surface of the lead frame body 12 in the longitudinal direction are formed with regions 18 reduced in a strength of bonding between the resin leakproof tape 13 and the lead frame body 12. In this embodiment, the region 18 is constructed by (smooth) plating 19 with, for example, Ag, Ni, Pd or Au. This plating 19 is formed by a pulse power source. The lead frame body 12 can be also roughened by a known method.

In addition, the region 18 has a gap 20 of 0.05 to 2 mm from the notched end of each of the notched parts 15, 16. When the bonding strength in the end of the lead frame body is too low, there is fear of the occurrence of a problem such as a catch due to peeling of the resin leakproof tape 13 during a previous process of de-taping. The gap 20 is not essential in the embodiment, but in a case where the region 18 has the gap 20, the bonding strength becomes higher than the case where the gap 20 is not provided. The plating 19 has a width of about 0.05 to 3 mm and this width will suffice, but the present invention is not limited to the width of this numerical value. By this plating 19, the strength of bonding between the lead frame body 12 and the resin leakproof tape 13 of the portion of its plating 19 becomes lower than that of the other portion and further, the resin leakproof tape 13 bulges by the thickness of the plating 19, and peel properties are increased more. The plating 19 has a thickness of, for example, about 0.05 to 10 μm and this thickness will suffice, but the present invention is not limited to the thickness of this numerical value.

Figure 1B:
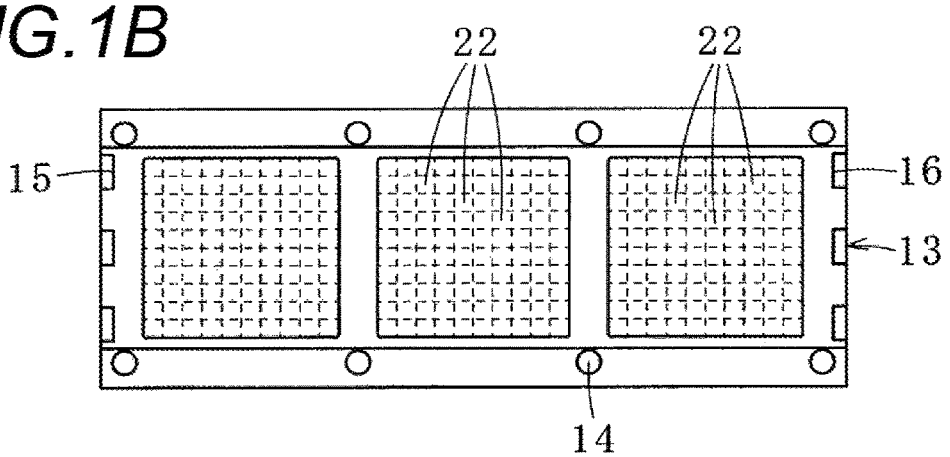
FIG. 1B is a plan view of a semiconductor apparatus after a semiconductor device is installed on the lead frame and is sealed with a resin.
Figure 1C:
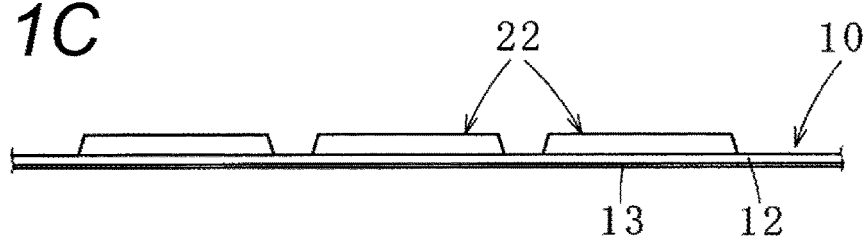
FIGS. 1C and 1D are front views of the lead frame.
Figure 1D:
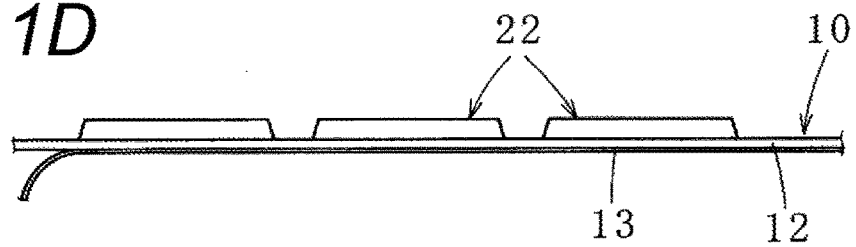

Subsequently, semiconductor devices are installed on the unit lead frames 11, and wire bonding is performed and the semiconductor devices are sealed with a resin, and multiple semiconductor apparatuses 22 arranged in a grid shape are formed on the lead frame 10 as shown in FIGS. 1B and 1D.

Figure 5A:
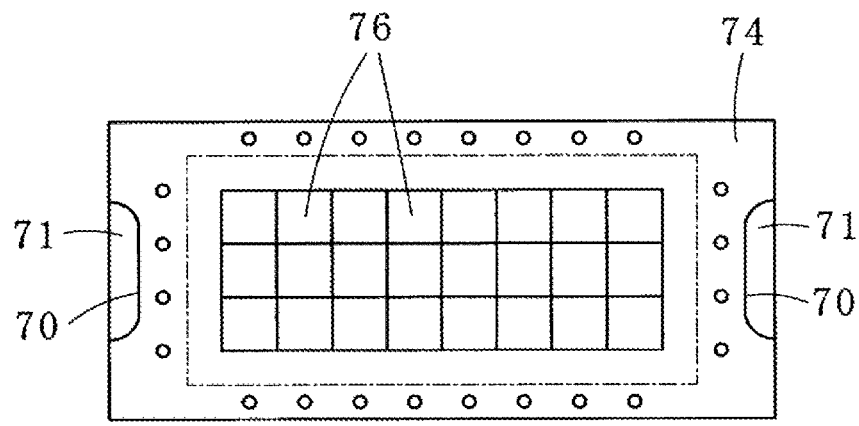
FIGS. 5A and 5B are explanatory diagrams of a lead frame according to a conventional example.
Figure 5B:
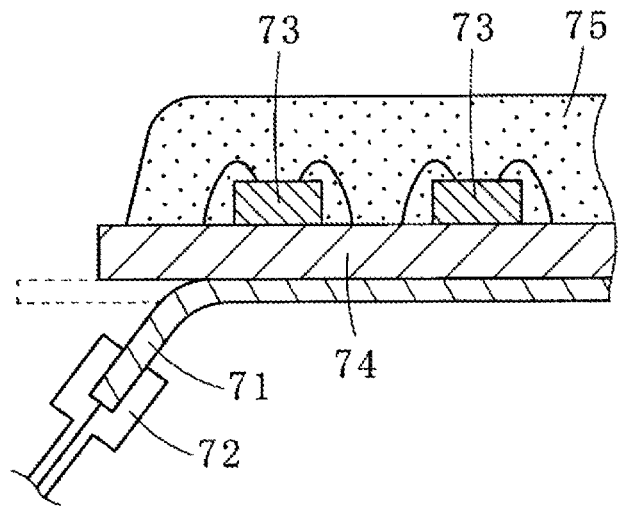

Then, as shown in FIG. 1D, a clamp (see FIG. 5B) is inserted into each of the notched parts 15, 16, and the resin leakproof tape 13 is directly pinched and is gradually peeled. Since the resin leakproof tape 13 is given the plating 19 in the vicinity of the peel starting point part 17, the resin leakproof tape 13 is easily peeled and permanent deformation is not caused in the lead frame 10.

Figure 3A:
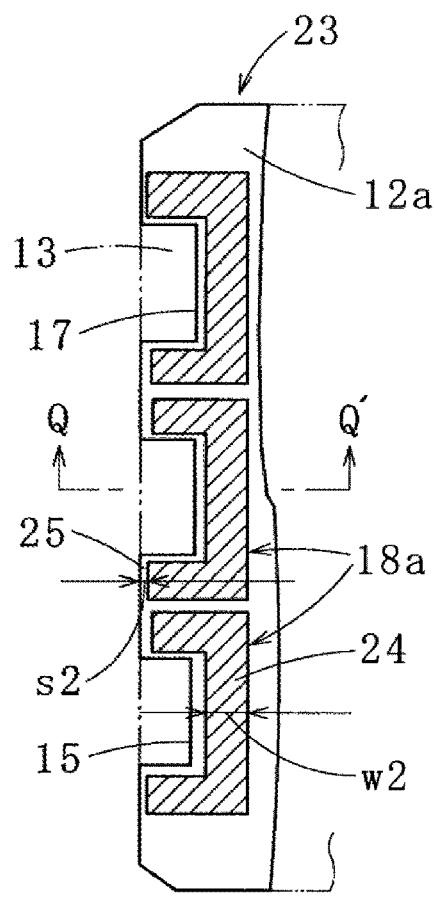
FIG. 3A is a partial back view of a lead frame according to a second embodiment of the present invention.
Figure 3B:
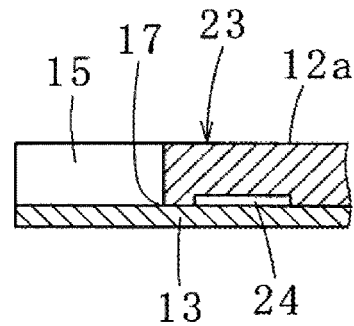
FIG. 3B is a cross-sectional view taken on arrow Q-Q' of FIG. 3A.

Next, a lead frame 23 according to a second embodiment of the present invention will be described with reference to FIGS. 3A and 3B, but detailed description is omitted by assigning the same numerals to the same components as those of the lead frame 10 according to the first embodiment. In this embodiment, a recessed thin part 24 is formed in a region 18a reduced in a strength of bonding to a lead frame body 12a. This recessed thin part 24 is formed by pressing and etching, and a depth of the recessed thin part 24 is, for example, about 50 to 90% of the thickness of the lead frame body 12a.

A length s2 of a gap 25 between the recessed thin part 24 and the notched end of each of notched parts 15, 16 is about 0.05 to 2 mm. This gap 25 is not essential in this embodiment, but is required in order that the periphery of the recessed thin part 24 is sealed with a resin leakproof tape 13 and the portion of the recessed thin part 24 forms space, and also increases a bonding strength like the first embodiment. Also, a decrease in strength of the lead frame body is prevented. A width w2 of the recessed thin part 24 is 0.05 to 3 mm, and sufficient space is formed, and the region 18a reduced in the strength of bonding is formed. In addition, a method for peeling the resin leakproof tape 13 is similar to that of the lead frame 10 according to the first embodiment.

Figure 4A:
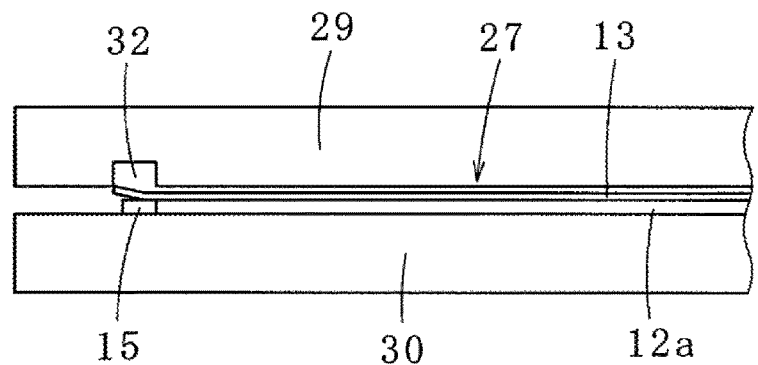
FIGS. 4A to 4C are explanatory diagrams of a manufacturing method of a lead frame according to a third embodiment of the present invention.
Figure 4B:
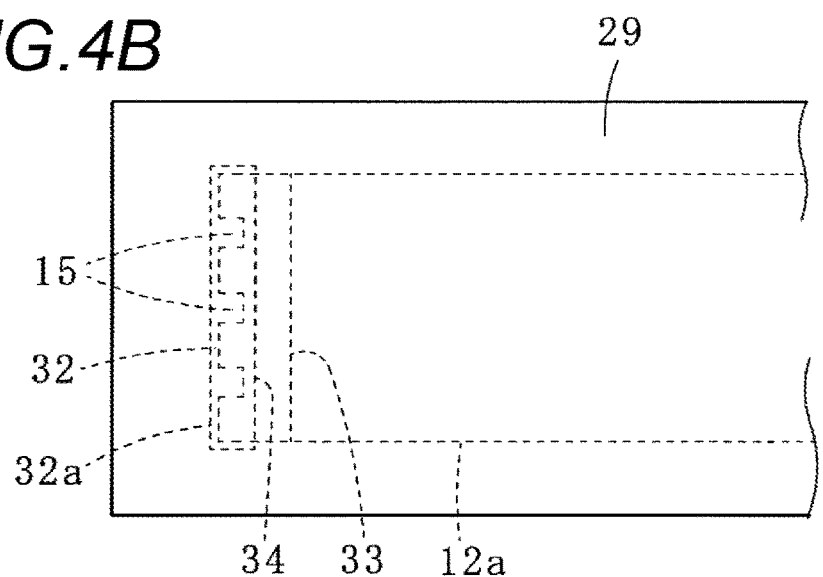
Figure 4C:
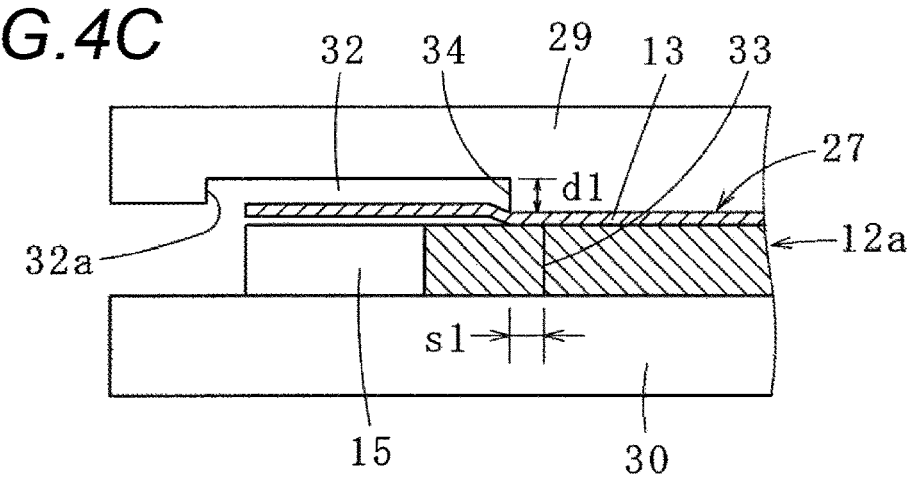

Subsequently, a manufacturing method of a lead frame 27 according to a third embodiment of the present invention will be described with reference to FIGS. 4A to 4C. Like the lead frames 10, 23 according to the first and second embodiments, ends of this lead frame 27 are formed with notched parts 15, 16, and a back surface of a lead frame body 12a is covered with a resin leakproof tape 13 so as to overlap the notched parts 15, 16, and the resin leakproof tape 13 is stuck on the back surface of the lead frame body 12a by heating both of the resin leakproof tape 13 and the lead frame body 12a using heater plates 29, 30.

The heater plate 29 (that is, a portion of the heater plate 29 corresponding to the notched parts 15, 16 and their periphery) abutting on both ends of the resin leakproof tape 13 is provided with a recessed part 32 (or a groove communicating in a width direction) to form a region reduced in a strength of bonding between the resin leakproof tape 13 and the lead frame body 12a, such that both ends of the lead frame body 12a are prevented from being pressed. A depth dl of the recessed part 32 is 0.01 to 0.1 mm, and a distance s1 between an inside end 34 of the recessed part 32 and a resin seal line 33 is 1 mm or more. In the resin seal line 33, the resin leakproof tape 13 is surely bonded to the lead frame body 12a. In addition, when the distance s1 is less than 1 mm, there is a risk of a resin leak because of being too near to a mold line. There is not particularly an upper limit to the distance s1, but based on common sense, the upper limit is preferably about 10 mm or less.

A position of a distal end 32a of the recessed part 32 can be any position from cases of 1) the inside (for example, the inside by 0.01 to 2 mm) beyond the end of the lead frame body 12a, 2) the same as the end of the lead frame body 12a, and 3) the outside beyond the end of the lead frame body 12a.

A step of peeling the resin leakproof tape 13 finally in this lead frame 27 is similar to that of the lead frames 10, 23 according to the first and second embodiments.

The present invention is not limited to the embodiments described above, and its configuration can also be changed without departing from the gist of the present invention. For example, the present invention has been described using the concrete dimensions, but the present invention is applied to dimensions different from the illustrated dimensions.

What is claimed is:

1. A lead frame in a predetermined shape, comprising:
a lead frame body;
a plurality of unit lead frames arranged in the lead frame body at a distance away from an end of the lead frame body;
a notched part extending through the lead frame body at the end of the lead frame body;
a resin leakproof tape stuck on a back surface of the lead frame body, and the plurality of unit lead frames; and
one of a plated region and a recessed thin region provided on the back surface of the lead frame body and located between an edge of the notched part and a closest end of the plurality of unit lead frames with a gap from the edge of the notched part, the one of a plated region and a recessed thin region being reduced in a strength of bonding between the resin leakproof tape and the lead frame body relative to an adjacent region of the back surface of the lead frame body.

2. The lead frame according to claim 1, wherein the gap is 0.05 to 2 mm and is formed from the edge of the notched part to the one of a plated region and a recessed thin region of the lead frame body.

3. The lead frame according to claim 1, wherein the one of a plated region and a recessed thin region reduced in the strength of bonding has a width of 0.05 to 3 mm.

4. The lead frame according to claim 1, wherein the plurality of unit lead frames are arranged in a matrix.

5. The lead frame according to claim 4, wherein the lead frame body has a rectangular shape, and
one area of the plurality of unit lead frames arranged in the matrix is provided.

6. The lead frame according to claim 4, wherein the lead frame body has a rectangular shape, and
two or more areas of the plurality of unit lead frames arranged in the matrix are provided along a longitudinal direction of the lead frame body.

7. The lead frame according to claim 6, wherein a plurality of notched parts are provided at opposite longitudinal ends of the lead frame body.

8. The lead frame according to claim 7, wherein the one of a plated region and a recessed thin region reduced in the strength of bonding extends in an area between the plurality of notched parts.

9. The lead frame according to claim 8, wherein the one of a plated region and a recessed thin region reduced in the strength of bonding includes a C-shaped portion.

10. The lead frame according to claim 1, wherein a plurality of semiconductor devices are installed on a front surface of the plurality of unit lead frames, respectively, opposite to the resin leakproof tape.

11. The lead frame according to claim 1, wherein a plurality of notched parts are provided at opposite ends of the lead frame body.

12. The lead frame according to claim 1, wherein a plurality of pilot holes are formed through the lead frame body.

* * * * *